(12) United States Patent  
Maegawa et al.

(10) Patent No.: US 8,309,865 B2
(45) Date of Patent: Nov. 13, 2012

(54) RESIN-MOLDED ARTICLE FIT WITH A METAL PLATE

(75) Inventors: Akihito Maegawa, Yokkaichi (JP); Shinyu Nagashima, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 483 days.

(21) Appl. No.: 12/617,016

(22) Filed: Nov. 12, 2009

(65) Prior Publication Data

US 2010/0124665 A1    May 20, 2010

(30) Foreign Application Priority Data

Nov. 19, 2008    (JP) .................................. 2008-295481

(51) Int. Cl.
*H01L 23/28* (2006.01)

(52) U.S. Cl. ....... 174/521; 174/68.2; 174/536; 174/541; 439/736; 439/625

(58) Field of Classification Search ................. 174/68.2, 174/536, 541, 521; 439/76.2, 625, 736
See application file for complete search history.

(56) References Cited

U.S. PATENT DOCUMENTS

| 7,414,194 | B2 * | 8/2008 | Nakayama et al. | 174/68.2 |
| 7,488,904 | B2 | 2/2009 | Maegawa et al. | |
| 7,520,759 | B2 * | 4/2009 | Seff et al. | 439/76.2 |
| 7,759,577 | B1 * | 7/2010 | Morales | 174/68.2 |
| 7,952,026 | B2 * | 5/2011 | Ramsey | 174/68.2 |

\* cited by examiner

*Primary Examiner* — Dhirubhai R Patel
(74) *Attorney, Agent, or Firm* — Gerald E. Hespos; Michael J. Porco

(57) ABSTRACT

A sensor unit 10 is provided with a metal plate 20 and a resin molded article 30 is formed integral to the metal plate 20. Busbars 50 are arranged in the resin molded article 30 and include exposed end portions 52 exposed from the resin molded article 30. Connecting portions 52A are provided at the leading ends of the exposed end portions 52 and are riveted to an oil temperature sensor 41 on the metal plate 20. Opposite lateral sides of the exposed end portions 52 are partly in contact with the resin molded article 30.

7 Claims, 14 Drawing Sheets

RESIN-MOLDED ARTICLE FIT WITH A METAL PLATE

BACKGROUND OF THE INVENTION

1. Field of the Invention

The invention relates to a resin molded article fit with a metal plate.

2. Description of the Related Art

U.S. Pat. No. 7,488,904 and FIGS. 11-14 herein disclose a resin molded article fit with a metal plate. With reference to FIG. 11, the metal plate is identified by the numeral 1 and the resin molded article is identified by the numeral 2. Busbars 3 are arranged in the resin molded article 2. Each busbar 3 includes an end portion 3A exposed from the resin molded article 2 and an electronic component 4 is riveted to the exposed end portion 3A of the busbar 3, as shown in FIG. 12. The resin molded article 2 fit with the metal plate 1 is mounted in a transmission and transmission oil in the transmission can exert hydraulic pressure on the resin molded article 2. The highly rigid metal plate 1 is intended to prevent the hydraulic pressure from deforming the resin molded article 2.

Opposite ends of the exposed end portions 3A of each busbar 3 are formed integral to the resin molded article 2 and hence are entirely in contact with the resin molded article 2, as shown in FIG. 13 or 14, to prevent deformation. However, even if deformations of the exposed end portions 3A can be prevented, stresses concentrate on parts connecting the exposed end portions 3A and the electronic component 4 to increase contact resistance when a hydraulic pressure acts on the exposed end portions 3A.

The invention was developed in view of the above situation and an object thereof is to prevent an increase of contact resistance while preventing the deformation of a busbar caused by a hydraulic pressure.

SUMMARY OF THE INVENTION

The invention relates to a resin molded article formed integrally with a metal plate. At least one busbar is arranged in the resin molded article and includes at least one exposed end portion exposed from the resin molded article. At least one connecting portion is provided near the leading end of the exposed end portion and is to be fixed to an electronic component arranged on the metal plate. Opposite lateral sides of parts of the exposed end portion are in contact with the resin molded article.

The above-described resin molded article fit with the metal plate may be used in a transmission and hydraulic pressure may act on the exposed end portion. Only parts of the exposed end portions have opposite lateral sides in contact with the resin molded article and frictional resistance between the opposite lateral sides of the exposed end portion and the resin molded article is small. As a result, the entire exposed end portion can be deformed resiliently and stresses are distributed over the entire exposed end portion without being concentrated on the connecting portion. Therefore, contact resistance will not increase and hydraulic pressure will not deform the busbar.

Opposite lateral sides of the connecting portion may be entirely in contact with the resin molded article. Thus, frictional resistance between the opposite lateral sides of the connecting portion and the resin molded article increases and movements of the connecting portion are restricted during riveting.

A connector portion may project from an outer peripheral edge of the resin molded article and at least partly accommodates an end portion of the busbar different from the exposed end portion.

At least one bulge may bulge out from the outer peripheral edge of the resin molded article in a projecting direction of the connector portion. The bulge is adjacent to the connector portion and substantially faces the exposed end portion. The exposed end portion may extend in a bulging direction of the bulge.

A dead space is formed at a position adjacent to the connector portion that projects from the outer peripheral edge of the resin molded article. However, the bulge is in the dead space facing the exposed end portion, thereby using the dead space efficiently. Further, stresses on the exposed end portion are distributed more easily since the bulge enables the exposed end portion to be lengthened.

Only one lateral side of the exposed end portions may be formed integral to the resin molded article except at the connecting portions.

The unit may comprise one or more guides and the electronic component may comprise one or more engaging guides that engage the one or more guides to guide an assembling operation of the electronic component.

A connection space may penetrate the resin molded article so that the exposed end portion is provided therein.

A part of the connection space that does not contact the lateral side of the exposed end portion may be wider than a part thereof held in contact with the lateral edge of the exposed end portion.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
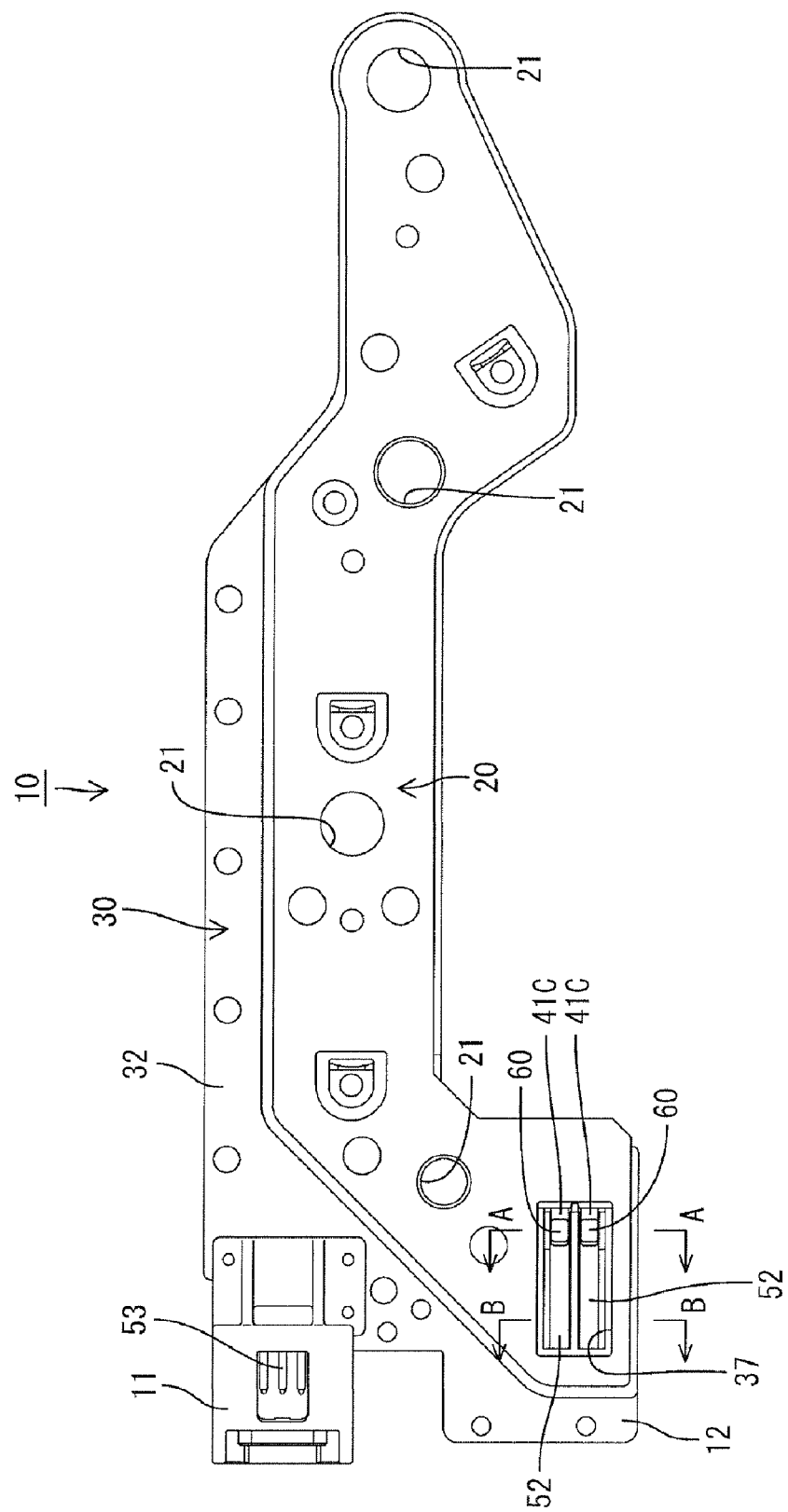
FIG. 1 is a view of a sensor unit when viewed from a metal plate side.
Figure 2:
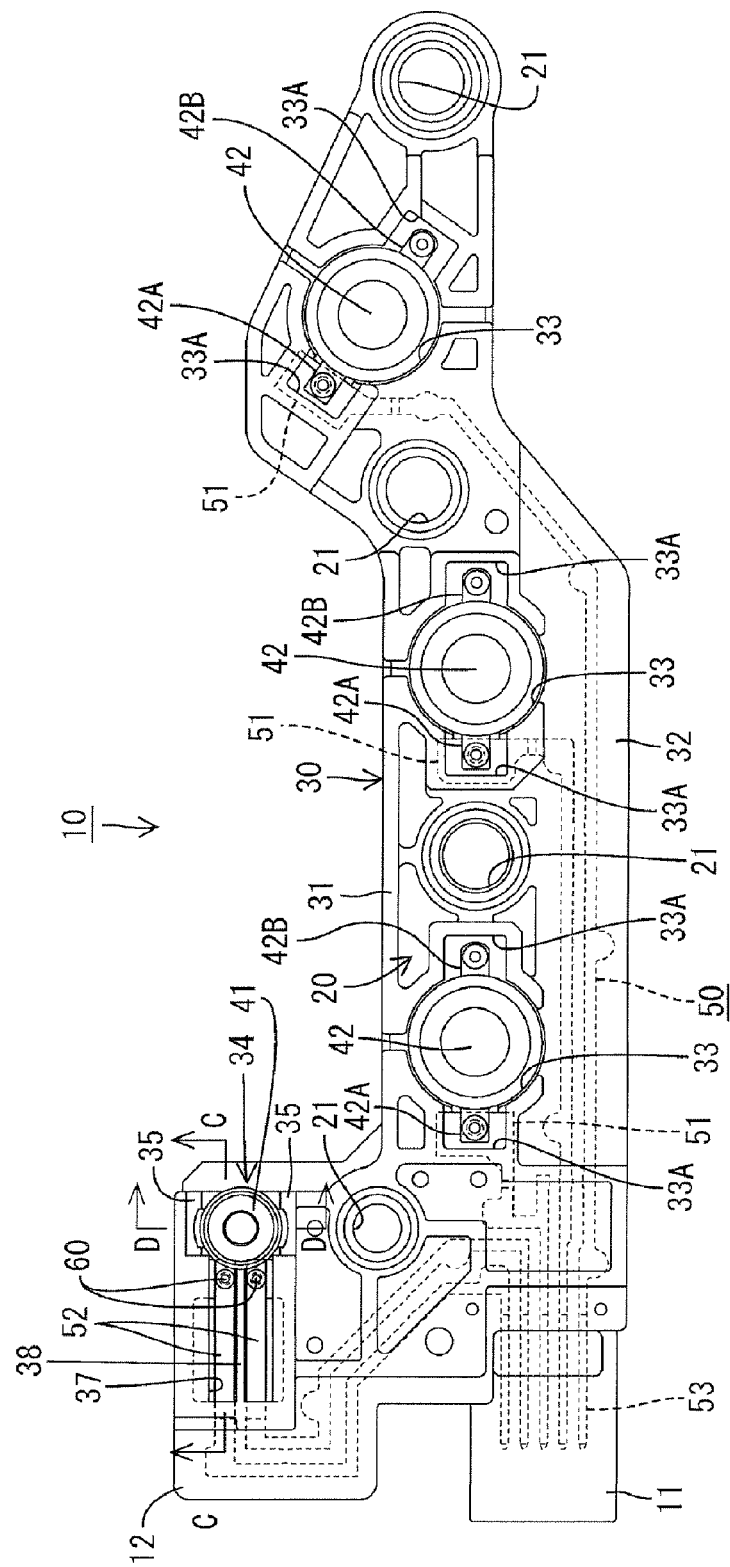
FIG. 2 shows a state where an oil temperature sensor is assembled with the sensor unit when viewed from a side opposite to the metal plate.

A sensor unit in accordance with the invention is identified by the numeral 10 in FIGS. 1 to 5 and is to be mounted on or in a device such as a transmission of an automotive vehicle and used in such a state as to be able to touch a transmission oil. As shown in FIG. 1, the sensor unit 10 has a metal plate 20, a resin molded article 30 formed integral to the metal plate 20 and at least one electronic component. As shown in FIG. 2, the electronic component includes an oil temperature sensor 41, one or more oil pressure switches 42 and the like.

The resin molded article 30 is made e.g. of synthetic resin (e.g. glass filled 6,6-nylon). Metallic busbars 50 are arranged in the resin molded article 30. The resin molded article 30 includes a primary molded portion 31 formed integrally on a surface of the metal plate 20 toward the front of the plane of FIG. 2. A secondary molded portion 32 is formed by insert molding and is integral to the primary molded portion 31. The busbars 50 excluding the opposite end portions thereof are embedded in the secondary molded portion 32.

Four substantially round connection holes 21 and three substantially round mounting recesses 33 are arranged alternately at intervals in a longitudinal direction in the sensor unit 10. Although not shown, the surface of the metal plate 20 is exposed at bottoms of the mounting recesses 33. The oil pressure switches 42 are mounted in respectively in the mounting recess 33 and are held in contact with the surface of the metal plate 20. Two cutouts 33A are formed in the surrounding wall of the mounting recess 33 at positions substantially facing each other. First and second terminals 42A, 42B of each oil pressure switch 42 project respectively into the cutouts 33A.

Lands 51 of the busbars 50 are arranged near the cutouts 33A. Each land 51 and the first terminal 42A of the oil pressure switch 42 are formed with substantially coaxial through holes. The land 51 and the first terminal 42A are riveted through these through holes. On the other hand, the second terminal 42B of the oil pressure switch 42 is held in substantially surface contact with the metal plate 20. The second terminal 42B and a part of the surface of the metal plate 20 are formed with substantially coaxial through holes and are riveted through these through holes.

The connection holes 21 penetrate the metal plate 20 and the resin molded article 30 to fix the sensor unit 10 to a mating member (not shown) in the transmission.

A sensor mounting portion 34 is provided near the leftmost connection hole 21 of the sensor unit 10. As shown in FIG. 2, the sensor mounting portion 34 is open laterally toward the outer peripheral edge of the resin molded article 30 and upwardly toward the front of the plane of FIG. 2. The oil temperature sensor 41 is to be mounted into the sensor mounting portion 34 from the outer peripheral edge side (right side in the shown example) of the resin molded article 30.

Figure 6:
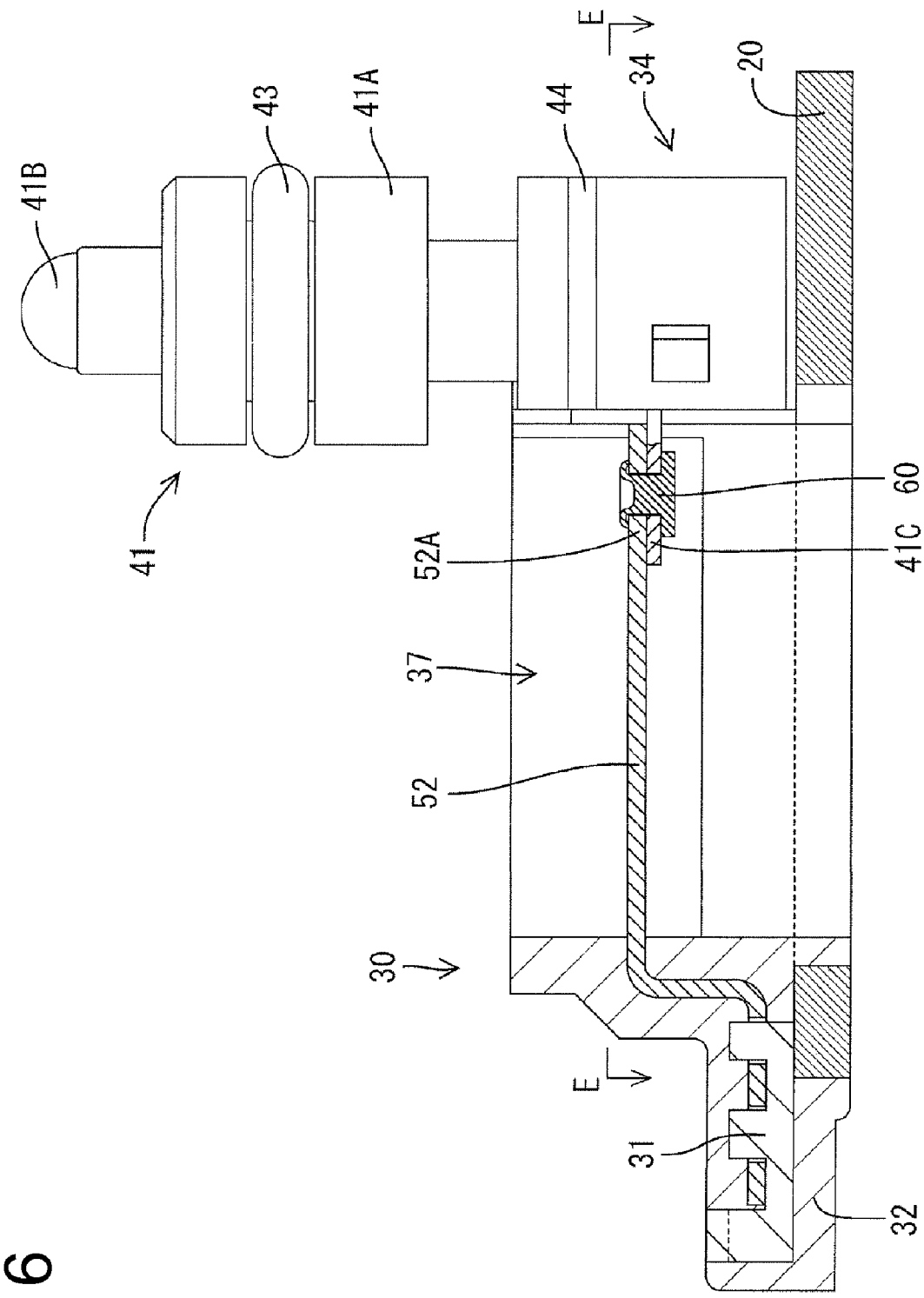
FIG. 6 is a section along C-C of FIG. 2.
Figure 7:
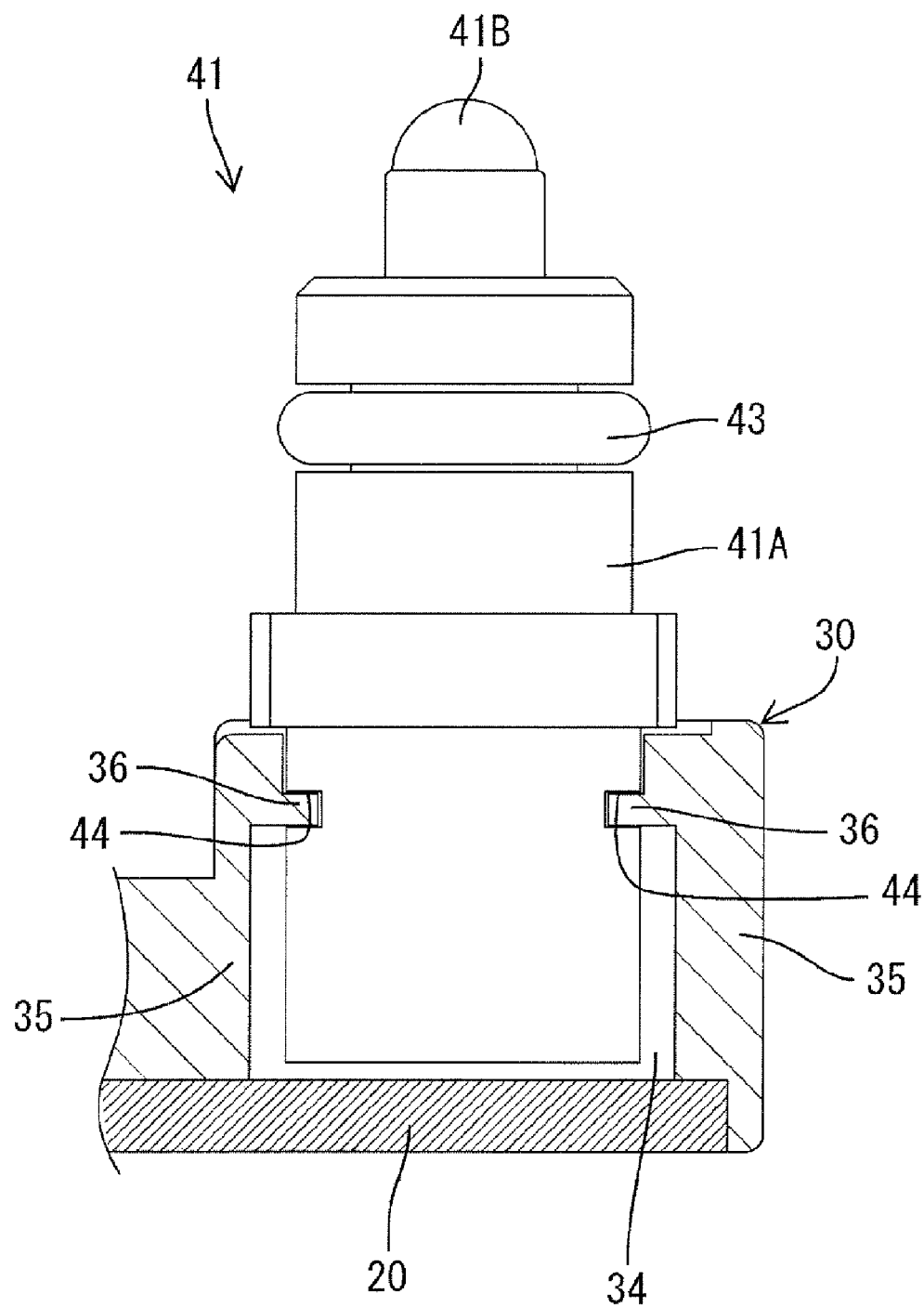
FIG. 7 is a section along D-D of FIG. 2.

As shown in FIG. 7, the oil temperature sensor 41 includes a main body 41A made e.g. of synthetic resin and formed by injection molding. A thermosensitive portion 41B is arranged substantially vertically in the main body 41A and an upper end of the thermosensitive portion 41B projects up from the upper end of the main body 41A. A thermistor (not shown) is embedded in the thermosensitive portion 41B by filling resin. A terminal 41C projects from the rear surface of the main body 41A in FIG. 6, which is substantially at a leading end in a mounting direction of the oil temperature sensor 41 into the sensor mounting portion 34. The terminal 41C is to be connected electrically with the thermistor.

A seal ring 43 is mounted on the outer circumferential surface of the main body 41A in a circumferential direction. On the other hand, a sensor insertion hole penetrates an outer wall of a transmission case (not shown) in a thickness direction. The main body 41A is inserted into the sensor insertion hole and the seal ring 43 is held tightly between the sensor insertion hole and the main body 41A to prevent leakage of the transmission oil in the transmission case to the outside.

Figure 3:
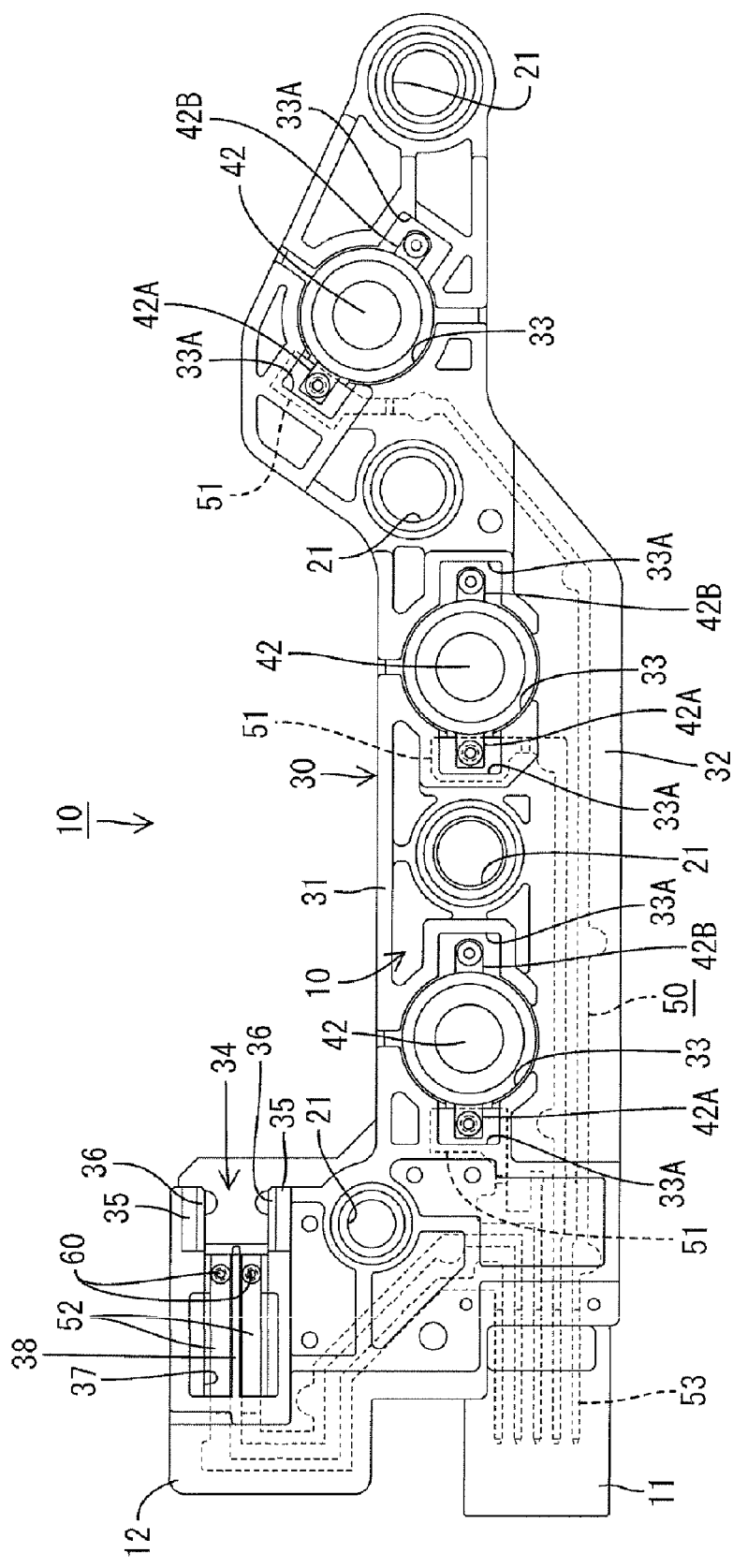
FIG. 3 shows a state before the oil temperature sensor is assembled with the sensor unit when viewed from the side opposite the metal plate.

Two opposed guiding walls 35 are provided on the sensor mounting portion 34 and an engaging projection 36 projects in each of the guiding walls 35. As shown in FIG. 3, the engaging projections 36 extend laterally in projecting directions of the terminal 41C. On the other hand, two engaging grooves 44 are formed in the main body 41A of the oil temperature sensor 41 and are engageable with the corresponding engaging projections 46, as shown in FIG. 7. Similar to the engaging projections 36, the engaging grooves 44 extend substantially in the lateral direction. Thus, assembly of the oil temperature sensor 41 is guided by sliding the oil temperature sensor 41 between the guiding walls 35 and into the sensor mounting portion 34 while engaging the engaging projections 36 and the engaging grooves 44. The oil temperature sensor 41 is held while being positioned vertically with respect to the sensor mounting portion 34.

A connection space 37 is formed at the left side of the sensor mounting portion 34, as shown in FIGS. 3 and 6, and communicates with an inner space of the sensor mounting portion 34. The connection space 37 penetrates the resin molded article 30 substantially vertically and substantially orthogonal to the surface of the metal plate 20. Exposed end portions 52 of two of the busbars 50 are cantilevered rightward from the left side wall of the connection space 37 and into the connection space 37. The exposed end portions 52 are exposed toward the upper and lower sides through the connection space 37.

The upper surface of the terminal 41C is held in substantially surface contact with the lower surfaces of the exposed end portions 52 of the busbars 50, as shown in FIG. 6, when the engaging projections 36 and the engaging grooves 44 are engaged. Connecting portions 52A are formed near the leading ends of the exposed end portions 52 of the busbars 50 and fixing holes penetrate the exposed end portions 52 vertically. On the other hand, through holes penetrate the terminal 41C and are substantially coaxial with the fixing holes of the connecting portions 52A. Rivets 60 fix the fixing holes to electrically connect the oil temperature sensor 41 and the busbars 50.

Figure 8:
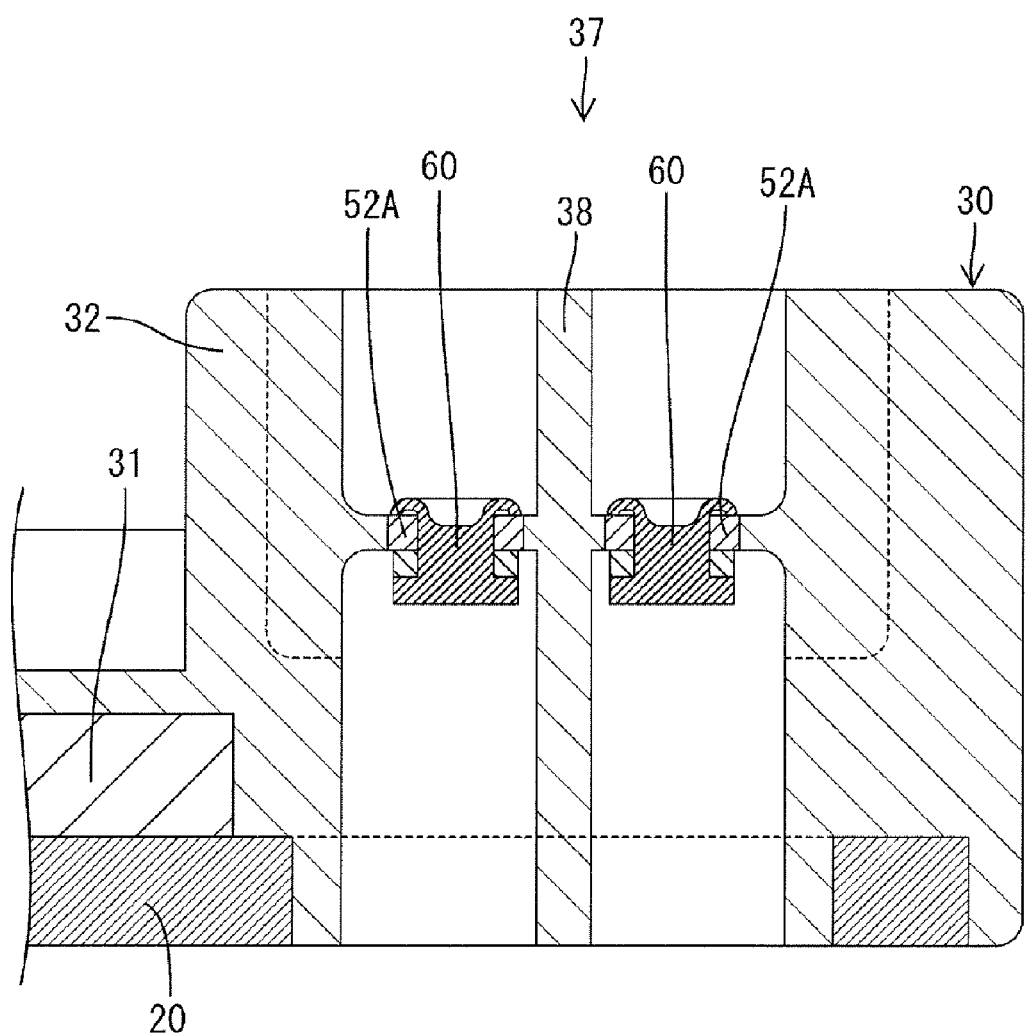
FIG. 8 is a section along A-A of FIG. 1.
Figure 9:
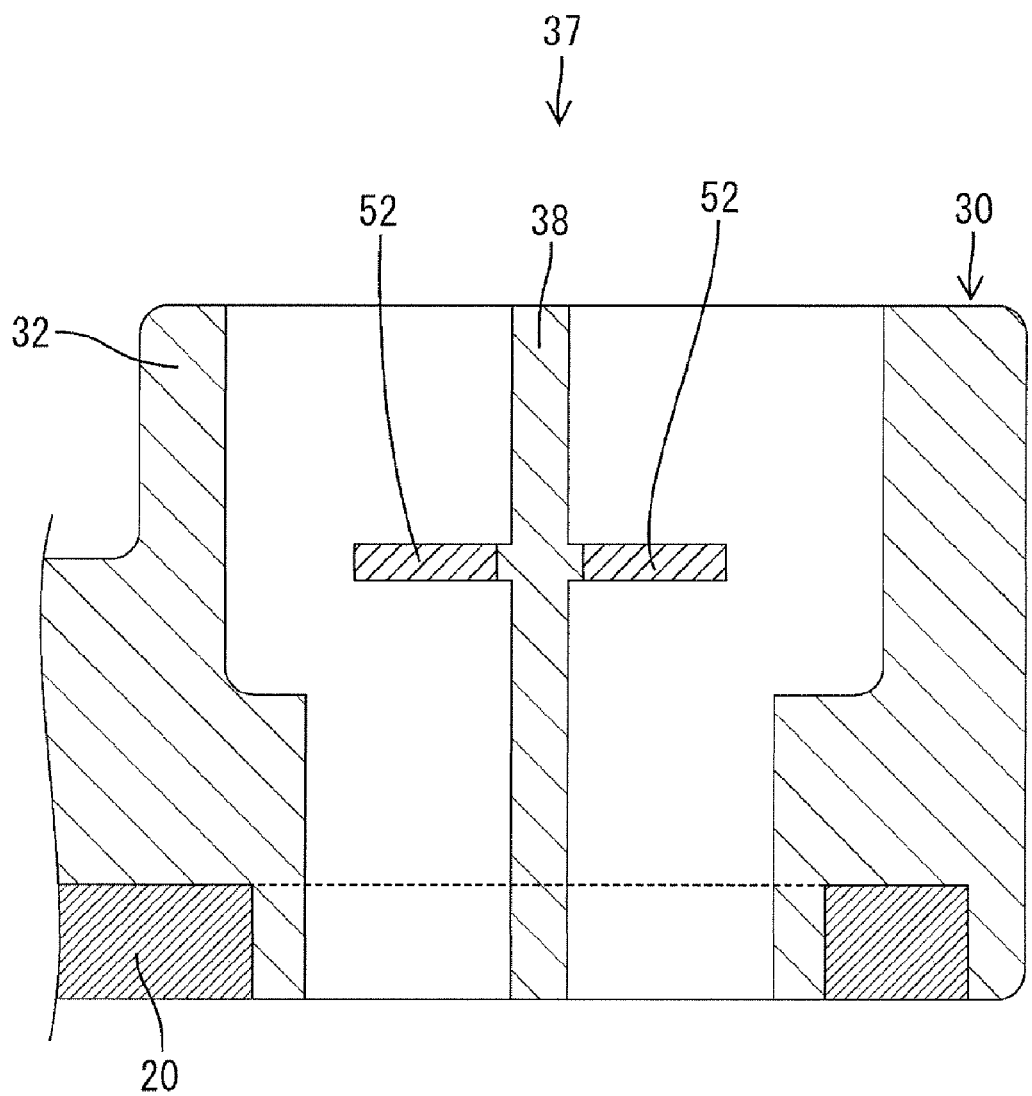
FIG. 9 is a section along B-B of FIG. 1.
Figure 10:
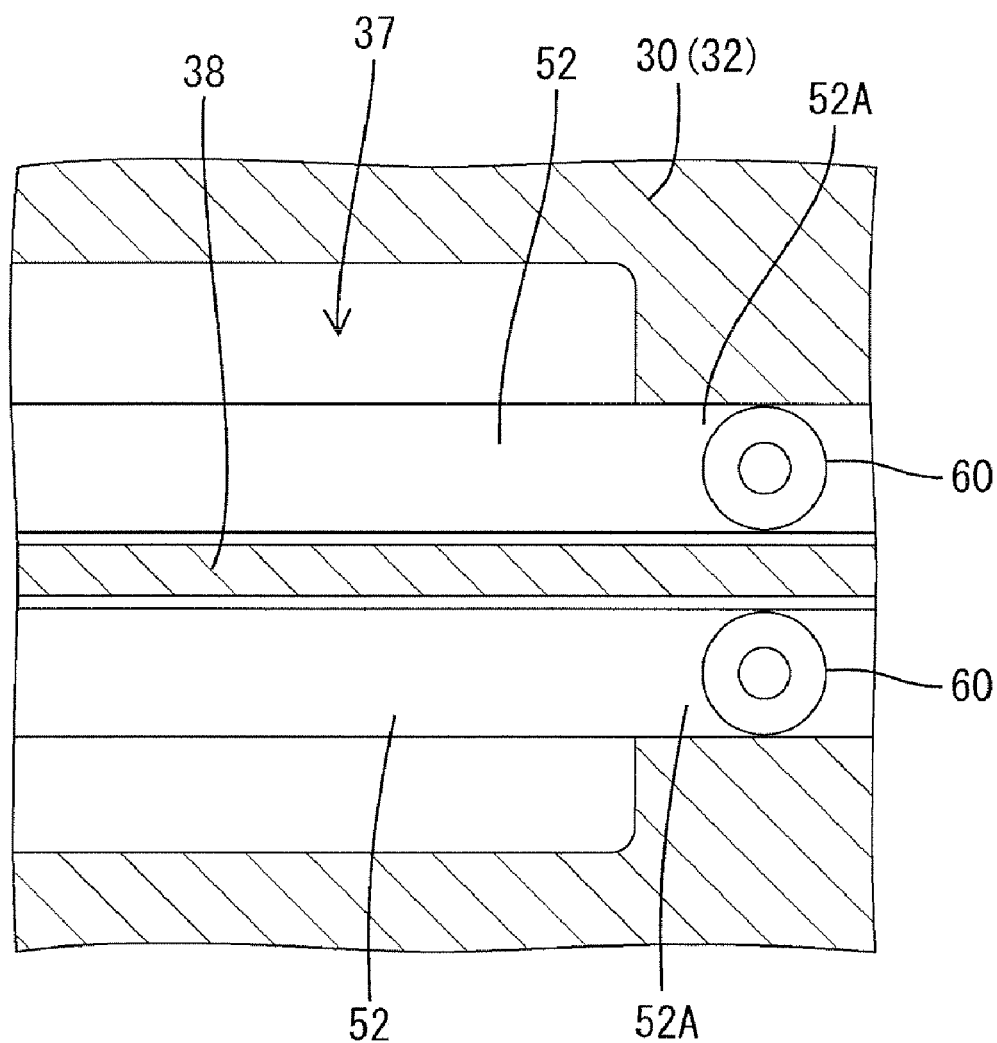
FIG. 10 is a section along E-E of FIG. 6.

As shown in FIG. 8, both opposite lateral sides of the connecting portions 52A of the busbars 50 are integral to the resin molded article 30. On the other hand, only one of the opposite lateral sides of the exposed end portion 52 is integral to the resin molded article 30 along areas from the left end of each exposed end portion 52 to the connecting portion 52A, as shown in FIG. 9 or 10. Specifically, the exposed end portions 52 are separated by a partition wall 38 in the resin molded article 30 and the lateral sides of the exposed end portion 52 facing the partition wall 38 are formed integral to the partition wall 38. In other words, the opposite lateral sides of the exposed end portions 52 are partly in contact with the resin molded article 30. A part of the connection space 37 not in contact with both lateral sides of the exposed end portions 52 is wider than a part thereof held in contact with both lateral edges of the exposed end portions 52 at the connecting portions 52A.

According to the above-described construction, the opposite lateral sides of the exposed end portions 52 are only partly in contact with the resin molded article 30 and frictional resistance between the opposite lateral sides of the exposed end portions 52 and the resin molded article 30 is small. Therefore the entire exposed end portions 52 can be deformed resiliently. Hence, stresses are distributed along substantially the entire exposed end portions 52 and do not concentrate on the connecting portions 52A. Thus, contact resistance does not increase and hydraulic pressure will not deform the busbars 50. Further, frictional resistance between the opposite lateral sides of the connecting portions 52A and the resin molded article 30 increases and movements of the connecting portions 52A are restricted e.g. upon the riveting operation.

Figure 4:
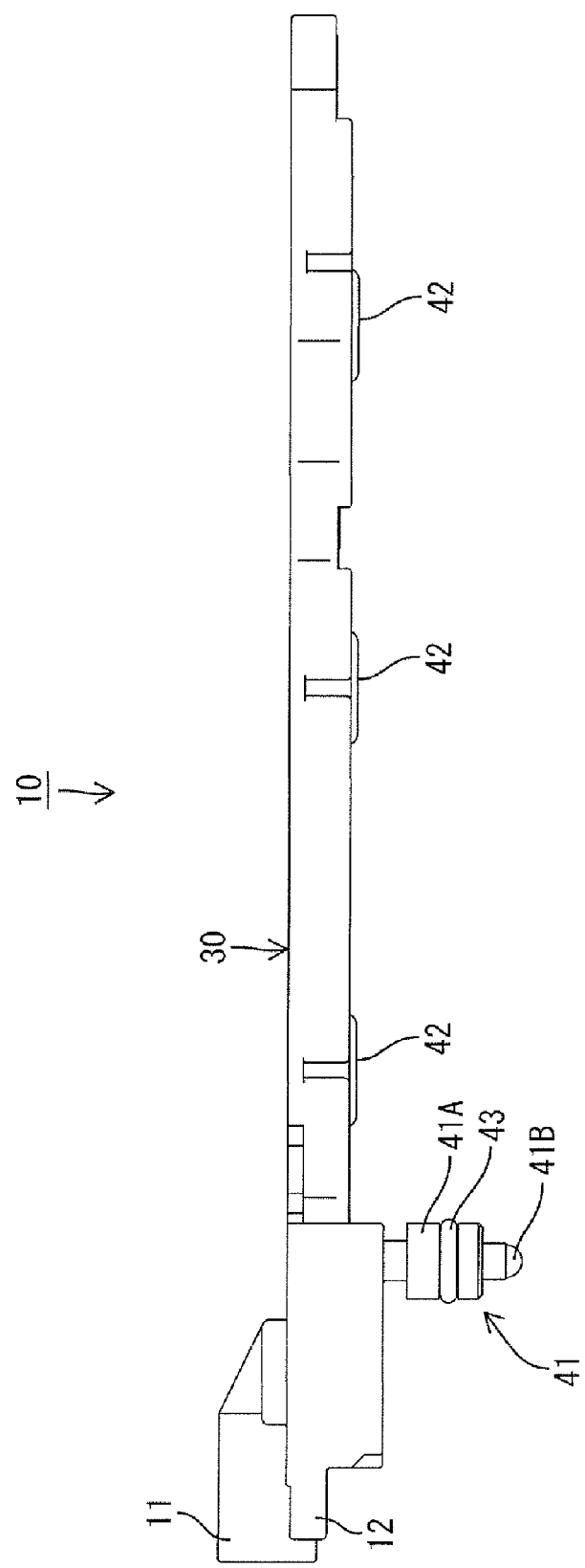
FIG. 4 is a view of the sensor unit when viewed in a direction along a surface of the metal plate.
Figure 5:
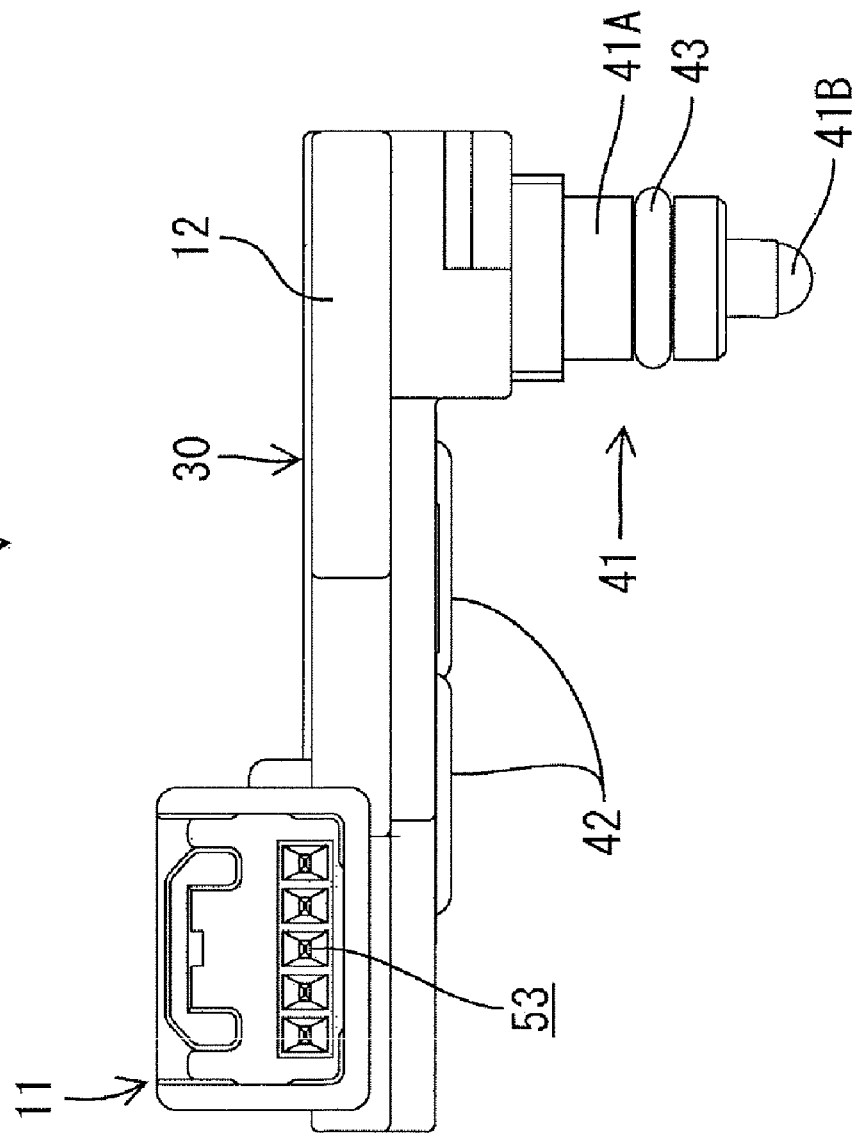
FIG. 5 is a view of the sensor unit when viewed from a connector side.

A connector portion 11 is provided on the left side of the outer peripheral edge of the sensor unit 10 and projects leftward, as shown in FIG. 2. The connector portion 11 projects from the resin molded article 30 in a direction substantially opposite to a projecting direction of the oil temperature sensor 41, as shown in FIG. 4. Further, as shown in FIG. 5, the connector portion 11 is a receptacle that at least partly covers tab-shaped terminals 53 formed at ends of the five busbars 50. Two of the tab-shaped terminals 53 are at ends of the busbars 50 opposite to the exposed end portions 52.

Figure 11:
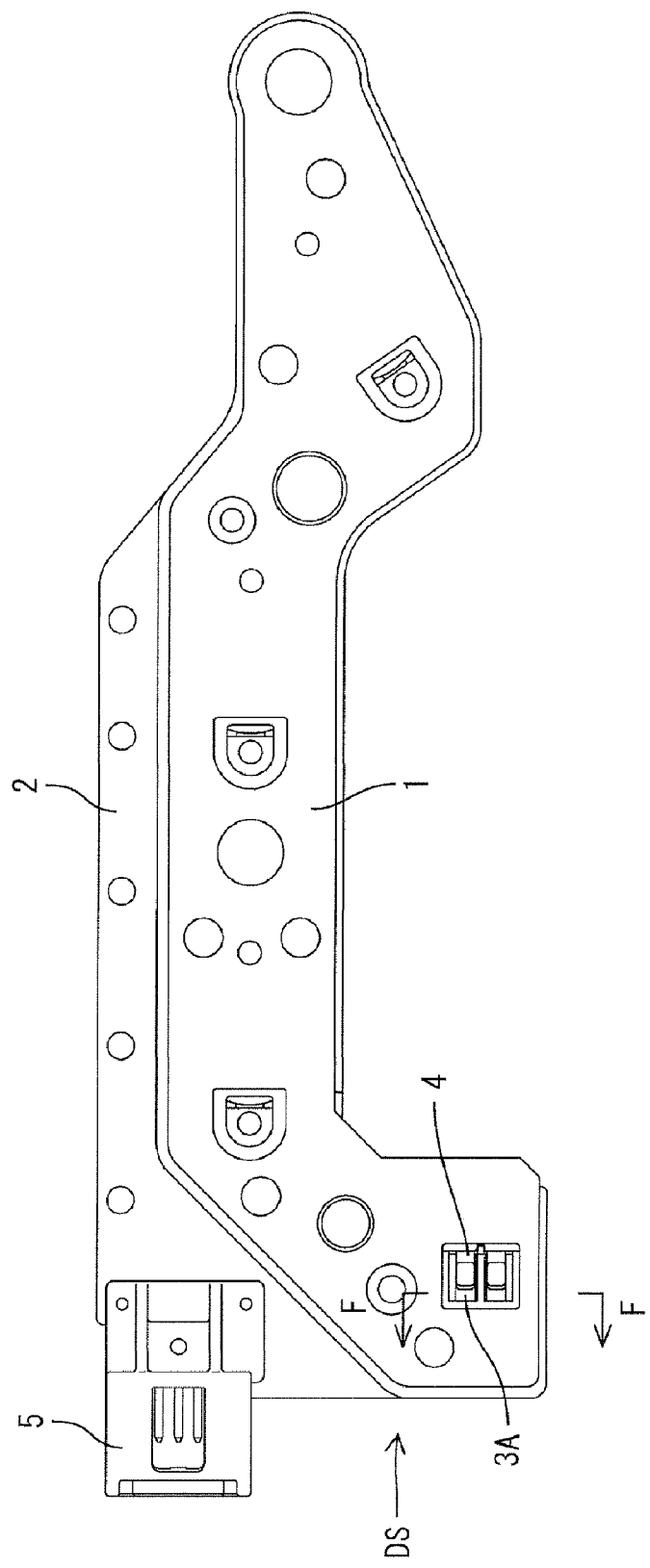
FIG. 11 is a view of a sensor unit having a conventional structure when viewed from a metal plate side.

A dead space normally would be formed at a position adjacent the connector portion. For example, the connector portion 5 enlarges the entire length of the conventional resin molded article 2 shown in FIG. 11 and forms a dead space DS adjacent to the connector portion 5. However, in this embodiment, a bulge 12 bulges out from the outer periphery of the sensor unit 1 substantially in the projecting direction of the connector portion 11. The bulge 12 is adjacent to the connector portion 11 and substantially faces the exposed end portions 52 thereby effectively utilizing the dead space.

The bulge 12 enables the outer peripheral edge of the metal plate 20 to be extended in a bulging direction of the bulge 12 and the connection space 37 also is extended in the bulging direction of the bulge 12. As a result, the exposed end portions 52 are extended in the bulging direction of the bulge 12 and the entire length of the exposed end portions 52 becomes longer by that much. Thus, stress acting on or along the exposed end portions 52 are distributed more easily and reduce stresses acting on the connecting portions 52A are reduced.

The oil temperature sensor 41 is slid between the guiding walls 35 of the sensor mounting portion 34 of the sensor unit 10 from the right side while the engaging projections 36 engage the engaging grooves 44. Thus, the oil temperature sensor 41 is held and positioned vertically. The terminal 41C of the oil temperature sensor 41 and the exposed end portions 52 of the busbars 50 are held vertically and in surface contact, and the corresponding fixing holes are arranged substantially coaxially.

The rivets 60 are inserted through the corresponding pairs of the fixing holes of the terminal 41 and the exposed end portions 52. The rivets 60 then are crimped using a crimping machine to fix the terminal 41C of the oil temperature sensor 41 and the exposed end portions 52 of the busbars 50 for electrically connecting the oil temperature sensor 41 and the busbars 50.

The sensor unit 10 then is mounted in the transmission will touch the transmission oil during use. Thus, the transmission oil will exert hydraulic pressure on the sensor unit 10. At this time, the exposed end portions 52 can receive stress due to the direct action of the hydraulic pressure in the connection space 37 and via the terminal 41C due to hydraulic pressure on the oil temperature sensor 41. These stresses have the potential to deform the busbars 50.

Figure 12:
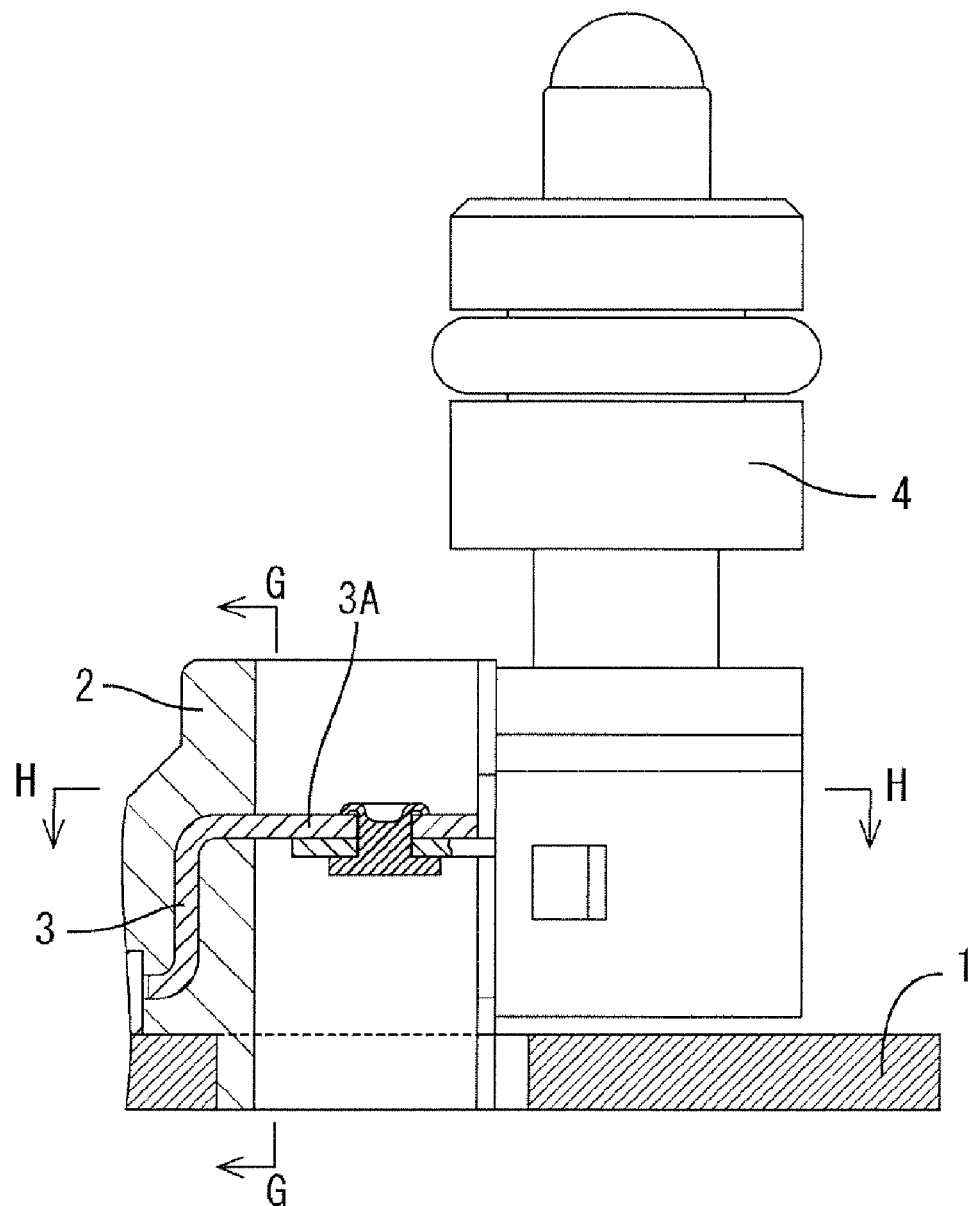
FIG. 12 is a section along F-F of FIG. 11.
Figure 13:
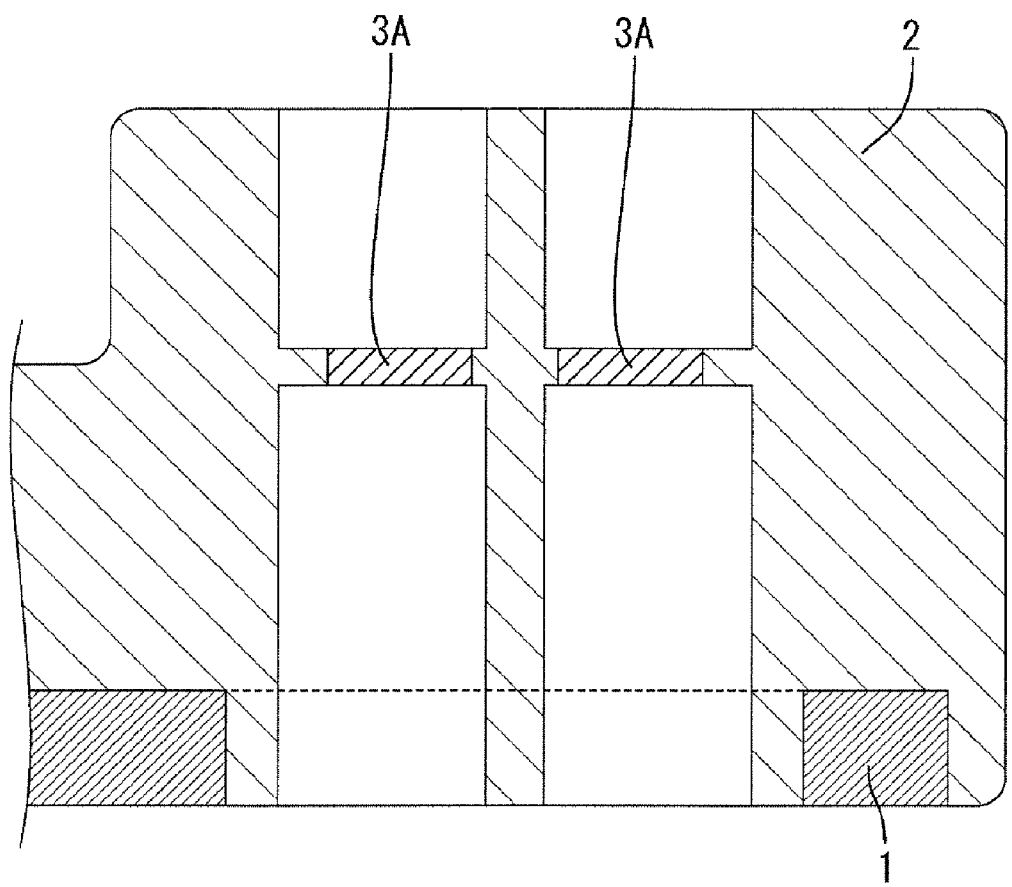
FIG. 13 is a section along G-G of FIG. 12.
Figure 14:
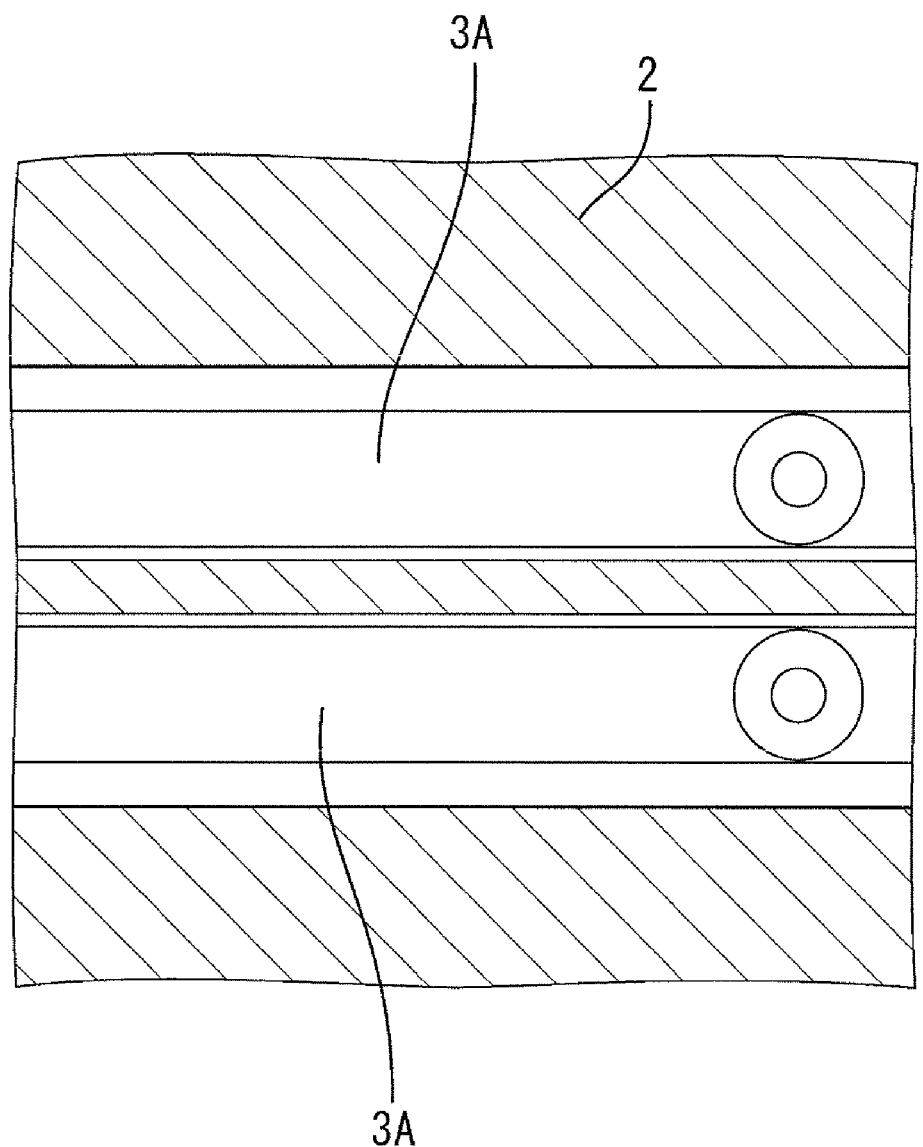
FIG. 14 is a section along H-H of FIG. 12.

However, only one lateral side of the exposed end portions 52 is integral to the resin molded article 30 except at the connecting portions 52A. Thus, frictional resistance between the exposed end portions 52 and the resin molded article 30 is small and the exposed end portions 52 are more easily and resiliently deformable from the base ends to the leading ends. Further, the exposed end portions 52 shown in FIG. 6 are longer than the conventional exposed end portions 3A shown in FIG. 12. Hence, stresses acting on the exposed end portions 52 are distributed more easily so that the terminal 41C and the connecting portions 52A can be held in contact. In this way, an increase of contact resistance in the connected parts of the busbars 50 and the oil temperature sensor 41 is prevented while the deformations of the busbars 50 are prevented.

As described above, one lateral side of each exposed end portion 52 is not in contact with the resin molded article 30 from the base end to the leading end except at the connecting portions 52A. Thus, the exposed end portions 52 can be deformed resiliently from the base ends and stress acting on the connected parts of the terminal 41C and the connecting portions 52A is reduced. Therefore, contact resistance in the connected parts of the oil temperature sensor 41 will not increase and the busbars 50 will not deform.

Both lateral sides of the connecting portions 52A are integral to the resin molded article 30. Thus, the busbars 50 are positioned more accurately and rivet insertion errors are eliminated. Further, the connecting portions 52A will not move vertically during riveting. Furthermore, lateral vibrations will not move the busbars 50 thereby improving reliability of the connecting portions 52A.

The bulge 12 is in the dead space at the position adjacent to the connector portion 11, thereby utilizing the dead space effectively. Further, the bulge 12 enables the exposed end portions 52 to be lengthened. Therefore, stresses acting on the connected parts of the terminal 41C and the connecting portions 52A are reduced further.

The invention is not limited to the above described and illustrated embodiment. For example, the following embodiments are also included in the technical scope of the present invention.

The one lateral sides of the exposed end portions 52 are formed integral to the resin molded article 30 in the ranges from the base ends to the leading ends of the exposed end portions 52 in the above-described embodiment. However, these lateral sides may be connected intermittently with the resin molded article 30 in the above ranges according to the invention.

The connecting portions 52A are provided at the leading ends of the exposed end portions 52 in the above-described embodiment. However, the connecting portions 52A may be provided at intermediate positions between the base ends and the leading ends of the exposed end portions 52.

The bulge 12 lengthens exposed end portions 52 in the above-described embodiment. However, they may be lengthened by lengthening the entire length of the sensor unit 10 without providing the bulge 12. Further, the bulge 12 need not necessarily be provided at the position adjacent to the connector portion 11.

What is claimed is:
1. A unit of a resin molded article fitted with a metal plate, comprising:
   a metal plate;
   a resin molded article formed integral to the metal plate; and
   at least one busbar arranged partly in the resin molded article and including at least one exposed end portion exposed from the resin molded article, the exposed end portion including opposite first and second lateral sides and a connecting portion provided at a leading end of the exposed end portion, the connecting portion being configured to be fixed to an electronic component arranged on the metal plate, both the first and second opposite lateral sides of the connecting portion being entirely in contact with the resin molded article, and only the first lateral side of the exposed end portion being in contact with the resin molded article at positions spaced from the connecting portion.

2. The unit of claim 1, further comprising a connector projecting from an outer peripheral edge of the resin molded article and at least partly accommodating one of the end portions of the busbar different from the exposed end portion.

3. The unit of claim 2, wherein at least one bulge bulges out in a projecting direction of the connector from the outer peripheral edge of the resin molded article at a position adjacent to the connector and substantially facing the exposed end portion.

4. The unit of claim 3, wherein the exposed end portion is extended in a bulging direction of the bulge.

5. The unit of claim 1, wherein the unit comprises at least one guiding member and the electronic component comprises at least one engaging guiding member engageable with the guiding member to guide an assembling operation of the electronic component.

6. The unit of claim 1, wherein a connection space penetrating the resin molded article is provided so that the exposed end portion is provided therein.

7. The unit of claim 6, wherein a part of the connection space not in contact with the second lateral side of the exposed end portion is wider than a part of the connection spaced held in contact with both lateral edges of the connecting portion.

* * * * *